United States Patent
Chen et al.

[11] Patent Number: 5,978,267
[45] Date of Patent: Nov. 2, 1999

[54] BIT LINE BIASING METHOD TO ELIMINATE PROGRAM DISTURBANCE IN A NON-VOLATILE MEMORY DEVICE AND MEMORY DEVICE EMPLOYING THE SAME

[75] Inventors: Pau-Ling Chen; Michael Van Buskirk, both of Saratoga; Shane C. Hollmer; Michael S. C. Chung, both of San Jose; Binh Quang Le; Vincent Leung, both of Mountain View; Shoichi Kawamura; Masaru Yano, both of Sunnyvale, all of Calif.

[73] Assignees: Advanced Micro Devices, Inc., Sunnyvale, Calif.; Fujitsu Limited, Kawasaki, Japan

[21] Appl. No.: 09/175,647

[22] Filed: Oct. 20, 1998

[51] Int. Cl.$^6$ ............................. G11C 16/04; G11C 16/06
[52] U.S. Cl. .............................. 365/185.17; 365/185.18; 365/185.23
[58] Field of Search ......................... 365/185.17, 185.18, 365/185.23, 185.26, 185.33; 711/5

[56] References Cited

U.S. PATENT DOCUMENTS

| | | | |
|---|---|---|---|
| Re. 35,838 | 7/1998 | Momodomi et al. | 365/185.17 |
| 5,243,701 | 9/1993 | Muramatsu et al. | 711/5 |
| 5,572,464 | 11/1996 | Iwasa | 365/185.18 |
| 5,671,176 | 9/1997 | Jang et al. | 365/185.18 |
| 5,691,944 | 11/1997 | Kondoh | 365/185.18 |
| 5,715,194 | 2/1998 | Hu | 365/185.18 |
| 5,734,609 | 3/1998 | Choi et al. | 365/185.17 |
| 5,793,677 | 8/1998 | Hu et al. | 365/185.17 |
| 5,831,903 | 11/1998 | Ohuchi et al. | 365/185.17 |

*Primary Examiner*—David Nelms
*Assistant Examiner*—Trong Phan
*Attorney, Agent, or Firm*—Fliesher, Dubb, Meyer & Lovejoy

[57] ABSTRACT

In the programming of a non-volatile memory device, such as a NAND flash memory device 100, a positive bias voltage $V_{bias}$ is applied to a bit line 44 to set a respective memory gate 44$a$ in a programmed state. In a further embodiment, the positive bias voltage $V_{bias}$ is obtained by dividing the select drain gate voltage $V_{cc}$ using two resistors 56 and 58 connected in series.

10 Claims, 4 Drawing Sheets in a conventional NAND non-volatile
memory device, the word line voltage $V_1$ signifying a
"programmed" state for a word line is typically on the order
of about 20 V, whereas the word line voltage $V_2$ signifying
a "no program" state for the word line is typically on the
order of about 10 V.

BIT LINE BIASING METHOD TO ELIMINATE PROGRAM DISTURBANCE IN A NON-VOLATILE MEMORY DEVICE AND MEMORY DEVICE EMPLOYING THE SAME

TECHNICAL FIELD

The present invention relates to a method of operating a non-volatile memory device and a memory device employing the same, and more particularly, to a method of programming a NAND non-volatile memory device and a memory device employing the same.

BACKGROUND ART

Non-volatile memory devices have been developed by the semiconductor integrated circuit industry for various applications such as computers and digital communications. Examples of non-volatile memory devices include conventional flash electronically erasable programmable read-only memories (EEPROMs). A conventional EEPROM typically includes a plurality of NAND gates arranged in an array on a semiconductor chip.

A conventional NAND gate typically has a dual gate structure which includes two field oxide regions on a silicon substrate, a thin tunnel oxide layer between the two field oxide regions, a polysilicon floating gate which comprises a first polysilicon (POLY-1) layer on the tunnel oxide layer, an interpolysilicon dielectric stack such as an oxide-nitride-oxide (ONO) stack on the floating gate, and a polysilicon control gate which comprises a second polysilicon (POLY-2) layer on the dielectric stack. This dual gate structure of a conventional NAND flash memory device is known to a person skilled in the art.

FIG. 1 shows a typical circuit diagram of an array of NAND flash memory gates 2a, 2b, 4a, 4b, 6a and 6b as part of a non-volatile memory device on a semiconductor integrated circuit. The NAND gates 2a, 2b, 4a, 4b, 6a and 6b each have a conventional dual gate structure with a POLY-1 floating gate and a POLY-2 control gate. The floating gates of the NAND gates 2a and 2b are connected together in series along a first bit line 2, the floating gates of the NAND gates 4a and 4b are connected together in series along a second bit line 4, and the floating gates of the NAND gates 6a and 6b are connected together in series along a third bit line 6. The control gates of the NAND gates 2a, 4a and 6a are connected along a first word line 7, and in a similar manner, the control gates of the NAND gates 2b, 4b and 6b are connected along a second word line 8.

The word lines 7 and 8 are implemented to program the respective words comprising the respective bits represented by the memory states stored in the NAND gates 2a, 4a, 6a and 2b, 4b, 6b along the word lines 7 and 8, respectively. When a specific word is being programmed, a "program" voltage $V_1$ on the order of about 20 V is applied to the word line to enable the bits of the word along the word line to be programmed by the respective bit lines. FIG. 1 shows an example in which the word represented by the memory states of the NAND gates 2a, 4a, 6a, . . . on the word line 7 is being supplied with the "program" voltage $V_1$ signifying that the word along the word line 7 is being programmed.

A word line which is not being programmed is applied a "no program" voltage $V_2$ on the order of about 10 V representing a "no program" state for the word represented by the memory states of the NAND gates along the word line to boost the channel potential of the inhibited bitlines. FIG. 1 shows an example in which the word represented by the memory states of the NAND gates 2b, 4b and 6b along the word line 8 is being supplied with the "no program" voltage $V_2$ signifying that the word along the word line 8 is not being programmed. In a conventional NAND non-volatile memory device, the word line voltage $V_1$ signifying a "programmed" state for a word line is typically on the order of about 20 V, whereas the word line voltage $V_2$ signifying a "no program" state for the word line is typically on the order of about 10 V.

As shown in FIG. 1, the conventional NAND flash memory device further includes a plurality of select drain gates 2c, 4c and 6c connected along a voltage line 10 and a plurality of select source gates 2d, 4d and 6d connected along another voltage line 12. The select drain gates 2c, 4c and 6c and the select source gates 2d, 4d and 6d each have a single polysilicon gate structure. The voltage line 10, which is connected to the polysilicon gates of the select drain gates 2c, 4c and 6c, is supplied with a DC voltage $V_{cc}$ which is constantly maintained on the select drain gates 2c, 4c and 6c during the operation of the NAND flash memory device. In a conventional NAND flash memory device, the DC voltage $V_{cc}$ for the select drain gates 2c, 4c and 6c is typically on the order of about 3.3 V. In a conventional NAND flash memory device, the select source gate voltage line 12, which is connected to the polysilicon gates of the select source gates 2d, 4d and 6d, is connected to ground. The DC select source gate voltage $V_{ss}$ is therefore 0 V.

To program a particular bit of a word on a particular word line, such as the word line 7 in FIG. 1, the bit lines 2, 4 and 6 are each supplied with either a "program" voltage or a "program-inhibit" voltage such that the NAND gates 2a, 4a and 6a on the respective bit lines 2, 4 and 6 are programmed with memory states each representing either a logic bit "1" or a logic bit "0". In a conventional NAND flash memory device, a NAND gate is not programmed if the bit line to which the NAND gate is connected is supplied with a "no program" bit line voltage $V_{cc}$, which is the same as the DC voltage for the select drain gates 2c, 4c and 6c.

FIG. 1 also shows an example of a self-boosting operation of an inhibited bit line. When the voltage $V_{cc}$ is applied to the bit line 2, which is an inhibited bit line, the NAND gate 2a on the word line 7 maintains a "program-inhibited" or "no program" state. In a conventional NAND flash memory device, an inhibited state typically signifies a logic bit "1", which is the default bit for NAND gates not being programmed.

Furthermore, in the conventional NAND flash memory device as shown in FIG. 1, a "program state" typically represents a logic bit "0". When the bit line 6 is supplied with the DC select drain gate voltage $V_{cc}$, the NAND gate 6a on the word line 7 maintains a "no program" state which signifies a logic bit "1". The bits of the binary word stored on the word line 7 along which the NAND gates 2a, 4a, 6a . . . are disposed are thus programmed with logic bits 101 . . . . The applications of the bit line voltages $V_{cc}$ and $V_{ss}$ do not affect the NAND gates 2b, 4b and 6b on the word line 8 because it is applied the "no program" word line voltage $V_2$. Each of the words on the respective word lines and each of the bits on the respective bit lines can thus be programmed with logic bits "1" and "0", depending upon whether the "program" voltage $V_1$ or the "no program" voltage $V_2$ is applied to each of the word lines while the select drain gate voltage $V_{cc}$ or the select source gate voltage $V_{ss}$ of 0 V is applied to each of the NAND gates along the respective bit lines.

FIG. 2 is a simplified plan view of a typical physical layout of the conventional NAND flash memory device of FIG. 1 implemented as a semiconductor integrated circuit 14. A first polysilicon (POLY-1) layer 16 is formed on an oxide layer 15 which has been provided on a semiconductor substrate (not shown). The POLY-1 layer 16 has a pattern of vertical strips which serve as the bit lines 2, 4 and 6, respectively. The POLY-1 layer 16 also includes a horizontal polysilicon strip which serves as the select drain gate voltage line 10 for supplying the DC drain gate voltage $V_{cc}$ to the select drain gates 2c, 4c and 6c in FIG. 1. Referring back to FIG. 2, the POLY-1 layer 16 further includes another horizontal polysilicon strip 12 to serve as the select source gate voltage line 12, which is grounded, for maintaining the select source gates 2d, 4d and 6d at 0 V. The select drain gates 2c, 4c, 6c and the select source gates 2d, 4d, 6d are shown in the physical layout of FIG. 2 as rectangular portions 2c, 4c, 6c and 2d, 4d, 6d of the POLY-1 layer 16 along the select drain gate strip 10 and along the select source gate strip 12, respectively.

The POLY-1 layer 16 has a pattern of channel stop openings, also called channel stop implant windows 21 and 23, between the bit lines 2 and 4 and between the bit lines 4 and 6, respectively. Core field oxide regions 20 and 22, which are portions of the oxide layer 15, are exposed through the respective channel stop implant windows 21 and 23. The channel stop implant window 21 has edges 31 and 33 adjacent the select drain gate strip 10 and the select source gate strip 12, respectively. Similarly, the channel stop implant window 23 has edges 34 and 36 adjacent the select drain gate strip 10 and the select source gate strip 12, respectively. The polysilicon gates of the select drain gates 2c, 4c and 6c are connected to the single select drain gate strip 10, and the polysilicon gates of the select source gates 2d, 4d and 6d are connected to the single select source gate strip 12.

A second polysilicon "POLY-2" layer 26 has a pattern of horizontal strips including strips 7 and 8 which serve as the word lines 7 and 8 in FIG. 1, respectively. As shown in FIG. 2, the horizontal POLY-2 layer strips 7 and 8 serving as the respective word lines are provided on top of the POLY-1 layer 16 and the core field oxide regions 20 and 22. The areas in which the horizontal strips 7 and 8 of the POLY-2 layer 26 overlap the vertical strips 2, 4 and 6 of the POLY-1 layer 16 form the respective NAND gates 2a, 4a, 6a, 2b, 4b and 6b. In a conventional NAND flash memory device, an interpolysilicon dielectric stack such as an oxide-nitride-oxide (ONO) trilayer stack (not shown) is provided between the POLY-1 layer 16 and the POLY-2 layer 26 in the areas 2a, 4a, 6a, 2b, 4b and 6b to form the respective NAND gates. The interpolysilicon dielectric stack is conventional and is known to a person skilled in the art. The select drain gates 2c, 4c and 6c and the select source gates 2d, 4d and 6d each have only one polysilicon layer, and therefore no interpolysilicon dielectric stack is provided on these select gates.

The dimensions of NAND flash memory devices have been aggressively shrunk down in recent years in order to provide larger scale integration. When the dimensions of the NAND devices are shrunk down to a very small size, the physical distance between adjacent bit lines becomes short and the channel stop implant window between the adjacent bit lines becomes narrow. A field turn-on in the substrate region under the field oxide region beneath the polysilicon select drain gate strip 10 may be effected by applying the DC select drain gate voltage $V_{cc}$ to one of the bit lines 2, for example, and grounding another bit line 4, for example, adjacent to the bit line 2 which is applied the voltage $V_{cc}$, during the programming of the bits stored in the NAND memory gates 2a and 4a on the respective bit lines 2 and 4. The field turn-on in the substrate region under the select gate transistor field oxide region may cause the bits which are supposed to be program-inhibited with logic bit "1" to be "turned on" to a programmed memory state indicating logic bit "0". Therefore, a field turn-on is undesirable in that it causes a program disturbance during the programming of the NAND memory gates in a conventional non-volatile memory device.

In a conventional NAND non-volatile memory device, as the field regions are shrunk, there could be a leakage path between bit lines which results from a relatively low doping concentration in the substrate region under the select drain gate transistor field oxide region. When a field turn-on occurs, an excess leakage current will flow between the bit lines during the programming of the NAND device, thereby causing program disturbance and product failure. Therefore, there is a need for a NAND flash memory device and a method of programming the memory device to eliminate the program disturbance caused by the field turn-on when some of the bit lines are applied the voltage $V_{cc}$ while others are grounded.

SUMMARY OF THE INVENTION

The present invention satisfies this need. In accordance with the present invention, a method of programming a non-volatile memory device generally comprises the steps of:

(a) applying a bias voltage of greater than 0 V to a first one of the bit lines to program a respective first memory gate with a logic bit representing a "programmed" state; and (b) applying a select drain gate voltage to a second one of the bit lines to inhibit a respective second memory gate such that it maintains a logic bit representing a "program-inhibited" state.

The non-volatile memory device to which the method according to the present invention is applicable generally comprises a plurality of bit lines, a plurality of word lines, a select drain gate and a select source gate, each of the word lines being applied either the first word line voltage representing the "word program" signal for a respective word on the word line or a second word line voltage representing a "word program-inhibit" or "no word program" signal for the respective word on the word line. The select drain gate is applied the DC select drain gate voltage, and the select source gate is applied a ground voltage of 0 V. A bias voltage of greater than 0 V is applied to the first bit line for programming the first memory gate with the logic bit representing the "programmed" state.

In an embodiment, the logic bit representing the "program-inhibited" or "no program" state is logic bit "1" and the logic bit representing the "programmed" state is logic bit "0". The bias voltage applied to one of the bit lines for programming the bit line with logic bit "0" may be in the range of 0.1 V to 0.3 V, for example, on the order of about 0.2 V.

In a further embodiment, the bias voltage can be obtained by dividing the DC select drain gate voltage by a predetermined ratio by using a plurality of resistors, for example, two resistors connected in series. One of the resistors may be connected to the DC select drain gate voltage and the other resistor may be connected to ground, and the bias voltage can be obtained by dividing the DC select drain gate voltage between the two resistors, with the ratio of the resistance of the second resistor to the sum of the resistances of the first and second resistors being equal to the predetermined ratio of the bias voltage to the DC select drain gate voltage.

The present invention also provides a non-volatile memory device, such as a NAND flash memory device, which generally comprises:

(a) an array of memory gates arranged in a plurality of columns and a plurality of rows;

(b) a plurality of word lines each connected to a respective one of the rows of the memory gates, each of the word lines capable of receiving either a first word line voltage representing a "word program" signal for a respective word on the word line, or a second word line voltage representing a "word program-inhibit" signal for the respective word on the word line; and (c) a plurality of bit lines each connected to a respective one of the columns of the memory gates, each of the bit lines capable of receiving a bias voltage of greater than 0 V to program a respective one of the memory gates on the respective bit line receiving the bias voltage and the respective word line receiving the first word line voltage with a logic bit representing a "programmed" state, and capable of receiving a select drain gate voltage to maintain a logic bit representing a "program-inhibited" state on the respective memory gate.

In an embodiment, the bias voltage is in the range of 0.1 V to 0.3 V, and in a further embodiment, the bias voltage is on the order of about 0.2 V. The non-volatile memory device may further include at least one select drain gate capable of receiving a DC select drain gate voltage and at least one select source gate capable of receiving a DC select source gate voltage, which is grounded at 0 V.

In a further embodiment, a resistor network is provided in the non-volatile memory device to divide the DC select drain gate voltage by a predetermined ratio to obtain the positive bias voltage. For example, the resistor network may comprise two resistors connected in series, with one of the resistors capable of receiving the DC select drain gate voltage and the other resistor capable of being connected to ground. The bias voltage is obtained by dividing the DC select drain gate voltage between the two resistors, with the ratio of the resistance of the second resistor to the sum of the resistances of the first and second resistors being equal to the predetermined ratio of the bias voltage to the DC select drain gate voltage.

Advantageously, the present invention provides a method of programming a non-volatile memory device including a bit line biasing scheme to increase the field threshold voltage to prevent a bit line-to-bit line leakage in the substrate region under the select drain gate transistor field oxide region, thereby preventing program disturbances in the programming of a non-volatile memory device, such as a NAND array.

Moreover, the bit line biasing scheme according to the present invention can be easily achieved by dividing the DC select drain gate voltage, which is known, by a predetermined ratio to obtain the positive bias voltage. The DC select source gate voltage is grounded at 0 V. The present invention also provides a non-volatile memory device, such as a NAND flash memory device, with a select source gate voltage which is grounded at 0 V and a bias voltage of greater than 0 V for setting a memory gate on a respective bit line in a "programmed" state during the programming of the device, thereby avoiding program disturbances in the programming of the non-volatile memory array.

BRIEF DESCRIPTION OF THE DRAWINGS

The present invention will be described with respect to particular embodiments thereof, and references will be made to the drawings in which.

DETAILED DESCRIPTION OF PREFERRED EMBODIMENTS

Figure 3:
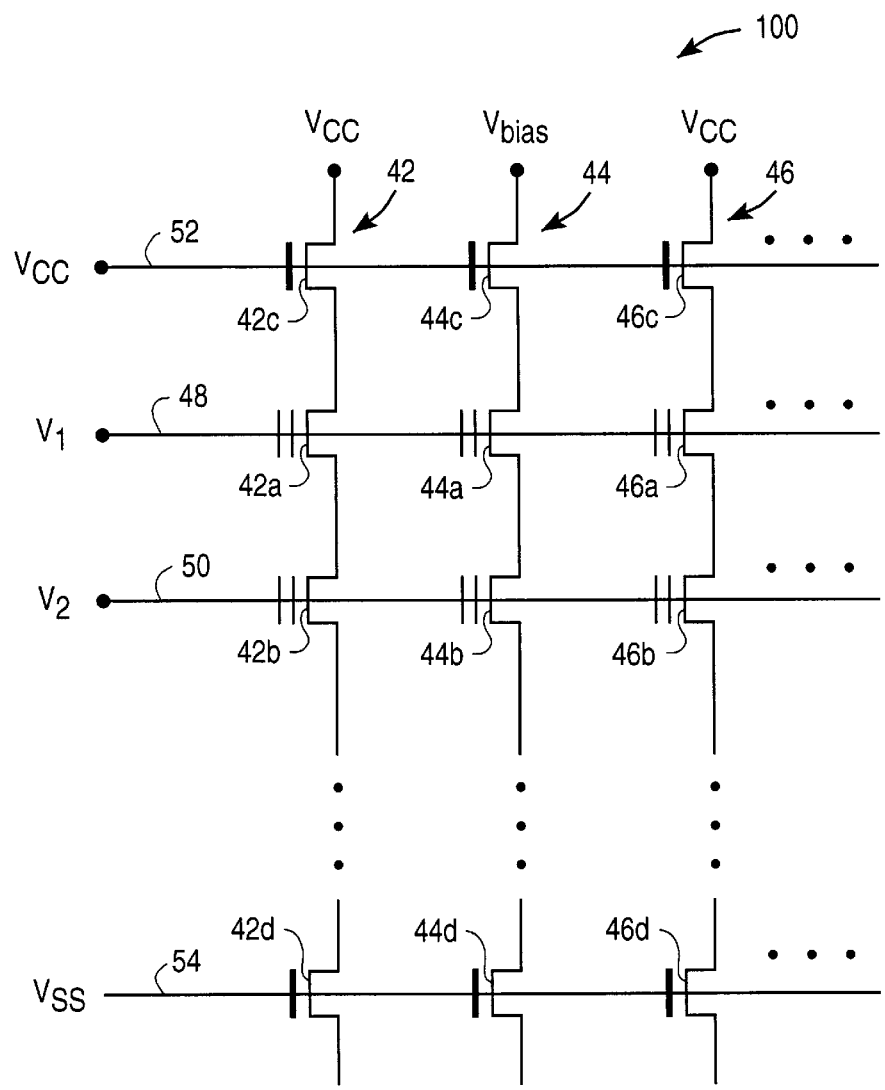
FIG. 3 is a circuit diagram of a non-volatile memory device according to the present invention showing one of the bit lines being supplied with a bias voltage of greater than 0 V for programming the bit line, and the select source gates being supplied with a DC select source gate voltage equal to the bias voltage.

FIG. 3 shows a circuit diagram of a non-volatile memory device according to the present invention illustrating a bit line biasing scheme in the programming of the non-volatile memory device. A NAND flash memory device 100 includes an array of NAND gates 42a, 44a, 46a, 42b, 44b and 46b arranged in a plurality of columns and rows. A plurality of bit lines 42, 44 and 46 are each connected to a respective column of the NAND memory gates. A plurality of word lines 48 and 50 are each connected to a respective row of the NAND memory gates. Each of the NAND memory gates 42a, 44a, 46a, 42b, 44b and 46b may have a conventional dual gate structure (not shown), including a floating gate comprising a first polysilicon (POLY-1) layer, a control gate comprising a second polysilicon (POLY-2) layer, and an interpolysilicon dielectric stack such as an oxide-nitride-oxide (ONO) trilayer stack between the POLY-1 and POLY-2 layers. The dual gate structure of a conventional NAND gate is known to a person skilled in the art.

Figure 1:
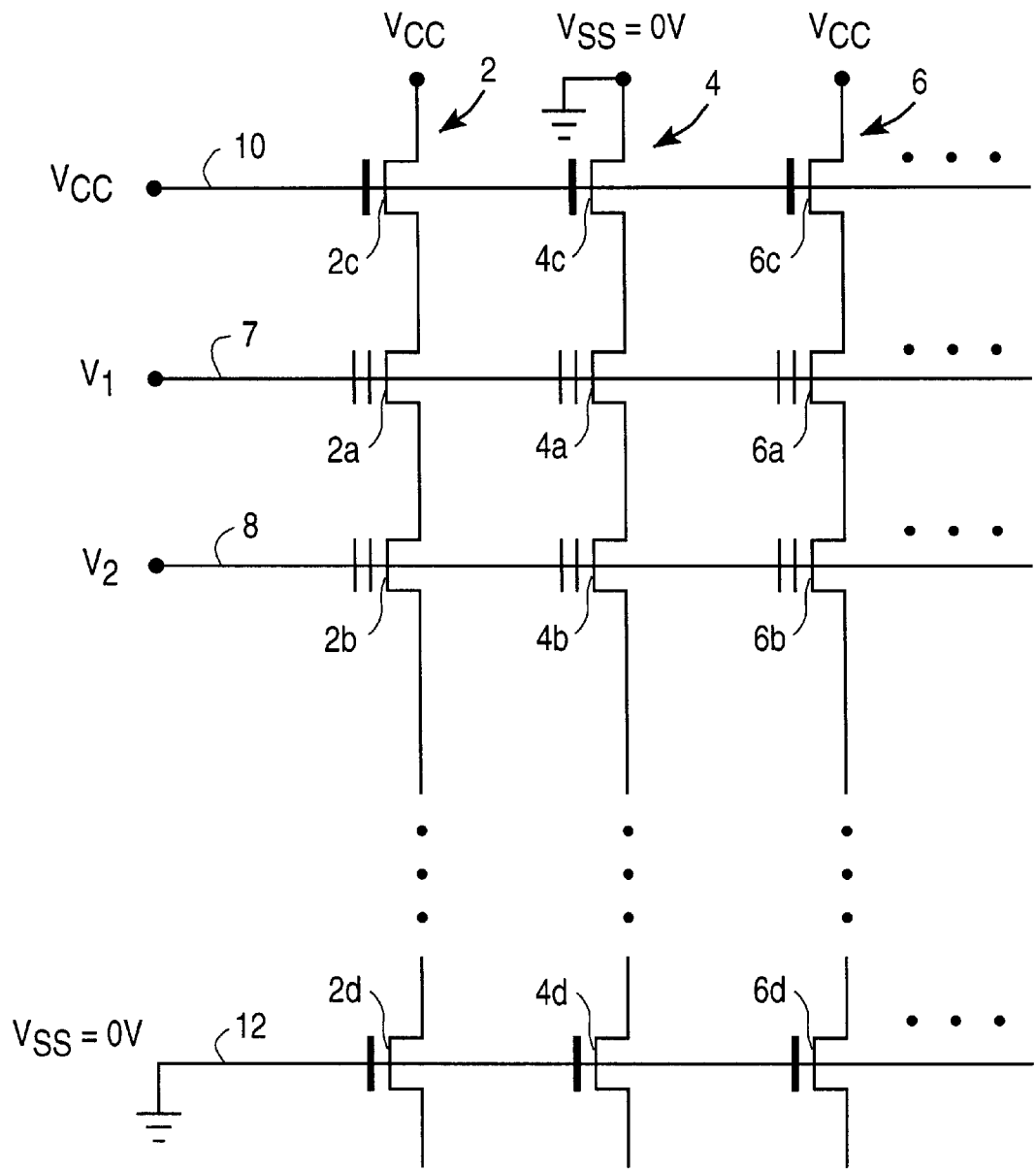
FIG. 1, described above, is a circuit diagram of a conventional NAND non-volatile memory device including an array of NAND gates with respective bit lines receiving either a select drain gate voltage $V_{cc}$ for a "no program" state or a bias voltage of 0 V for a "programmed" state.
Figure 2:
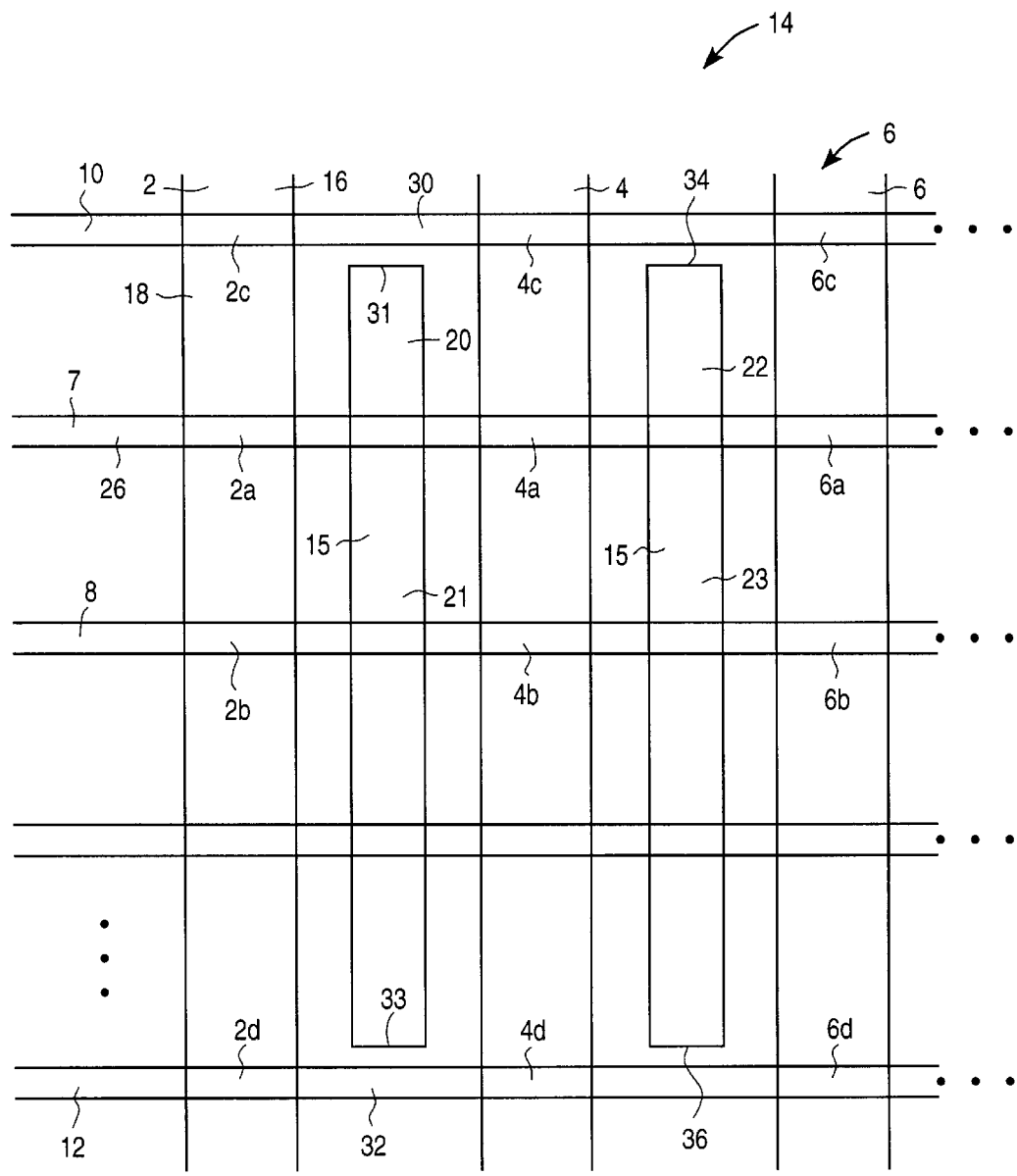
FIG. 2, described above, is a simplified plan view of the non-volatile memory device of FIG. 1 showing the physical layout of the NAND gates, bit lines, word lines, select drain gates and select source gates implemented as patterns of first and second polysilicon layers (POLY-1 and POLY-2 layers)

The bit lines 42, 44 and 46 are each connected to the floating gates of the NAND memory gates within the respective column. For example, the bit line 42 is connected to the floating gates of the NAND gates 42a, 42b, and other NAND gates within the first column. The bit line 44 is connected to the floating gates of the NAND gates 44a, 44b, and other NAND gates within the second column. The word lines 48 and 50 are each connected to the control gates of the NAND memory gates within the respective row. For example, the word line 48 is connected to the control gates of the NAND gates 42a, 44a, 46a, and other NAND gates within the first row, and the word line 50 is connected to the control gates of the NAND gates 42b, 44b, 46b, and other NAND gates within the second row. The physical layout of the NAND gates 42a, 44a, 46a, 42b, 44b and 46b, the bit lines 42, 44 and 46, and the word lines 48 and 50 may have a physical layout similar to that which is shown in FIG. 2 and described above.

FIG. 3 also shows a plurality of select drain gates 42c, 44c and 46c, which are connected to a DC drain voltage line 52 for receiving a DC select drain gate voltage $V_{cc}$. The DC drain voltage line 52 connecting the select drain gates 42c, 44c and 46c may be implemented on a semiconductor integrated circuit as a select drain gate strip 10 of the POLY-1 layer as shown in FIG. 2 and described above. The select drain gates 42c, 44c and 46c are each connected to a respective one of the bit lines 42, 44 and 46, which are connected to the respective columns of the NAND gates 42a, 42b, 44a, 44b and 46a, 46b for programming the bits along the respective bit lines.

The NAND flash memory device 100 further includes a plurality of select source gates 42d, 44d and 46d connected to a DC source voltage line 54 which is supplied with a DC select source gate voltage $V_{ss}$. The DC select source gate voltage $V_{ss}$ is at a ground voltage of 0 V. The select source gates 42d, 44d and 46d are each connected to a respective one of the bit line 42 44 and 46 for programming the respective columns of the NAND gates 42a, 42b, 44a, 44b and 46a, 46b. When implemented on a semiconductor integrated circuit, the DC source voltage line 54 may be implemented as a select source gate strip 12 of the POLY-1 layer as shown in FIG. 2 and described above.

In accordance with the present invention, a word stored in the memory gates along each of the word lines and the individual bits along the respective bit lines are programmed by selectively applying voltages to each of the word lines and each of the bit lines. FIG. 3 shows an example in which the word line 48 is applied a first word line voltage $V_1$ and the word line 50 is applied a second word line voltage $V_2$ to indicate whether the words stored in the memory gates on the respective word lines are being programmed. For example, the first word line voltage $V_1$ may represent a "word program" signal for a respective word on the word line 48.

When the first word line voltage $V_1$ is applied to the word line 48, the NAND gates 42a, 44a, 46a, . . . , which store the respective bits of the word on the word line 48, are applied the "word program" signal such that the individual bits of the word stored in the NAND gates 42a, 44a, 46a, . . . on the word line 48 may be programmed. The first word line voltage $V_1$ for representing the "word program" signal is typically on the order of about 20 V. For lower voltage non-volatile memory devices, the first word line voltage $V_1$ representing the "word program" signal for the respective word on the word line 48 may be a voltage less than 20 V.

The second word line voltage $V_2$ may represent a "no word program" or "word program-inhibit" signal for the respective word stored in the NAND gates 42b, 44b, 46b, . . . along the word line 50 in FIG. 3. The second word line voltage $V_2$ representing the "word program-inhibit" signal is typically on the order of about 10 V, although a lower "word program-inhibit" voltage $V_2$ may be applied to the word lines in lower voltage non-volatile memory devices.

FIG. 3 shows an example in which the first word line voltage $V_1$ is applied to the word line 48 to signify that the word on the word line 48 is being programmed, whereas the second word line voltage $V_2$ is applied to the word line 50 to signify that the word on the word line 50 is not being programmed. Each of the word lines in the NAND non-volatile memory device may be applied either the first word line voltage $V_1$ representing the "word program" signal or the second word line voltage $V_2$ representing the "word program-inhibit" signal to indicate whether the word on each of the word lines is being programmed.

In accordance with the present invention, the individual bits within each word to be programmed is applied either a bias voltage $V_{bias}$ of greater than 0 V to program a respective bit within the word with a logic bit representing a "programmed" state, or a voltage equal to the select drain gate voltage $V_{cc}$ to indicate that the respective bit is maintained with a logic bit representing a "no program" or "program-inhibited" state. FIG. 3 shows an example in which the bit line 42 is applied the select drain gate voltage $V_{cc}$ such that the NAND gate 42a on the word line 48, which has been applied the first word line voltage $V_1$ representing the "word program" signal, is program-inhibited, that is, maintained in a "no program" state in response to the applying of the select drain gate voltage $V_{cc}$ to the bit line 42. Depending upon the type of NAND flash memory device and the application in which it is used, the select drain gate voltage $V_{cc}$ may be on the order of either 3.3 V or 5 V.

FIG. 3 also shows an example in which a positive bias voltage $V_{bias}$ is applied to the bit line 44 to set the NAND gate 44a on the word line 48, which has been applied the first word line voltage $V_1$ representing the "word program" signal, in a "programmed" state. The bias voltage $V_{bias}$ may be a small positive voltage, for example, on the order of about 0.2 V, but should be higher than the ground voltage of 0 V. The NAND gate 44a is thus programmed with a logic bit representing a "programmed" state in response to the applying of the bias voltage $V_{bias}$ to the bit line 44. Each of the bit lines 42, 44 and 46 may be applied either the voltage $V_{bias}$ or the voltage $V_{cc}$ to set each of the respective NAND gates 42a, 44a and 46a in either the "programmed" state or the "program-inhibited" state, respectively.

In typical NAND flash memory applications, the logic bit for representing the "programmed" state is logic bit "1", whereas the logic bit for representing the "program-inhibited" state is logic bit "1". The default bit stored in a NAND gate indicating the "program-inhibited" state is "1", which is maintained by the select drain gate voltage $V_{cc}$, unless the bit line for the NAND gate is applied a bit line "programming" voltage equal to the positive bias voltage $V_{bias}$. Only the NAND gates that are set in the "programmed" state will store bit "0" when the bias voltage $V_{bias}$ is applied to the respective bit lines connected to the NAND gates. In the example shown in FIG. 3, the NAND gate 42a, which is applied a "program-inhibit" or "no program" voltage equal to the select drain gate voltage $V_{cc}$, stores bit "1", and the NAND gate 44a, which is applied the bit line "programming" voltage $V_{bias}$, stores bit "0". The NAND gate 46a, which is applied the "program-inhibit" bit line voltage equal to the select drain gate voltage $V_{cc}$ through the bit line 46, stores bit "1". The word on the word line 48 thus includes bits 101 . . . when the word stored in the NAND gates 42a, 44a, 46a, . . . is read from left to right.

In contrast with the word line 48, the word line 50 is not programmed even though the bias voltage $V_{bias}$ on the bit line 44 is also applied to the NAND gate 44b on the word line 50. The application of either the "programming" voltage $V_{bias}$ or the "program-inhibit" voltage $V_{cc}$ to the bit lines 42, 44 and 46 has no effect on any of the NAND gates 42b, 44b and 46b on the word line 50 because the second word line voltage $V_2$ representing the "word program-inhibit" signal is applied to the word line 50. The "word program-inhibit" voltage $V_2$ boosts the channel potential of the inhibited bit lines.

A DC voltage $V_{ss}$, which is grounded at 0 V, is constantly applied to the select source gates 42d, 44d and 46d along the source voltage line 54. In an embodiment, the "programming" bias voltage $V_{bias}$ and the "program-inhibit" voltage, which is equal to the select drain gate voltage $V_{cc}$, are supplied from separate sources. In an alternate embodiment, the bit line voltages $V_{cc}$ and $V_{bias}$ are supplied from a single voltage source with a voltage dividing network such as a resistor network.

Figure 4:
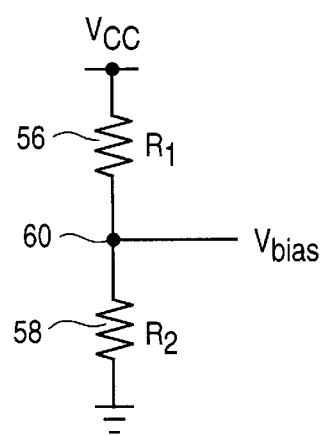
FIG. 4 is a circuit diagram of an embodiment of a resistor network for dividing the select drain gate voltage to obtain the select source gate voltage with two resistors connected in series according to the present invention.

An example of a voltage dividing network for supplying the positive bias voltage $V_{bias}$ is shown in FIG. 4, with two resistors 56 and 58 connected in series. The resistor 56 is connected to receive the select drain gate supply voltage $V_{cc}$ and the resistor 58 is connected to ground. The positive bias voltage $V_{bias}$ is obtained from an intermediate position or node 60 between the serially connected resistors 56 and 58. The first resistor 56 has a resistance $R_1$ and the second resistor 58 has a resistance $R_2$. The ratio of the second resistance $R_2$ to the sum of the first and second resistances $R_1$ and $R_2$ is determined by the ratio of the bias voltage $V_{bias}$ to the select drain gate voltage $V_{cc}$, using the following relationship:

$$\frac{R_2}{R_1 + R_2} = \frac{V_{bias}}{V_{cc}}$$

For example, if the bias voltage $V_{bias}$ is equal to 0.2 V and the select drain gate voltage $V_{cc}$ is equal to 3.3 V, then the ratio of $R_2$ to $R_1+R_2$ is 2/33. The resistances $R_1$ and $R_2$ can thus be determined from this relationship. In the above example in which $V_{bias}$=0.2 V and $V_{cc}$=3.3 V, if the second resistance $R_2$ is set to equal a normalized resistance value of 1Ω, then the first resistance $R_1$=15.5Ω, meaning that the resistance of the first resistor 56 is 15.5 times the resistance of the second resistor 58. Depending upon the application in which the memory device according to the present invention is used, the bias voltage $V_{bias}$ may be set at a positive voltage other than 0.2 V to prevent bit line-to-bit line current leakage caused by field turn-on in the substrate region under the select drain gate transistor field oxide region. A small positive voltage in the range of about 0.1 V to 0.3 V is usually sufficient to prevent the bit line-to-bit line current leakage. The DC select drain gate voltage may be set at 3.3 V, 5 V, or another voltage, depending upon the type of flash memory device and the application in which the device is used.

Figure 5:
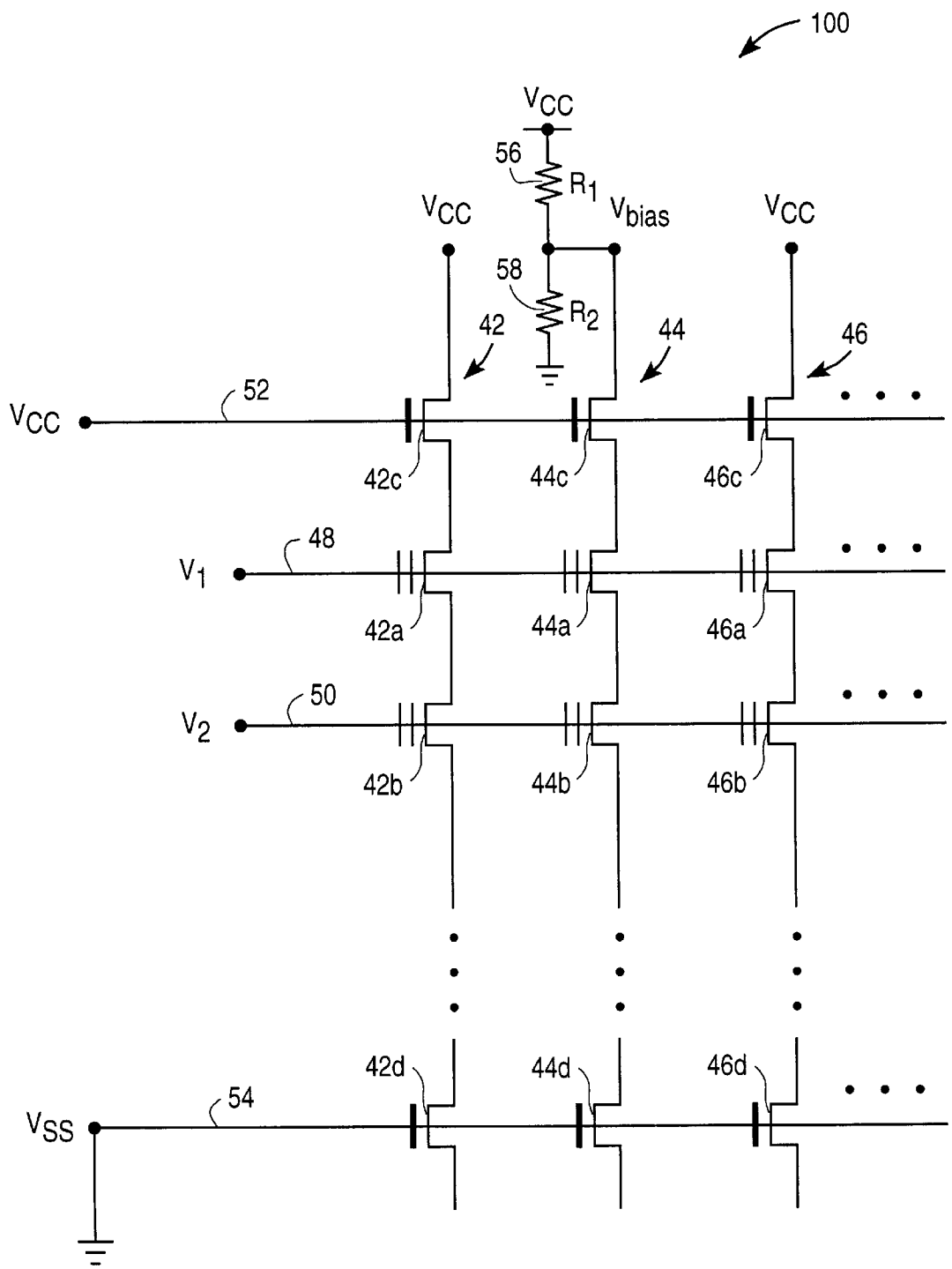
FIG. 5 is a circuit diagram of an embodiment of the non-volatile memory device according to the present invention including a circuit for dividing the select drain gate voltage to obtain the select source gate voltage of greater than 0 V.

FIG. 5 shows another embodiment of the NAND non-volatile memory device 100 according to the present invention in which the positive bias voltage $V_{bias}$ is obtained by dividing the "program inhibit" voltage, which is the same as the select drain gate voltage $V_{cc}$, using two serially connected resistors 56 and 58 The first resistor 56 is connected to the supply voltage $V_{cc}$, and the second resistor 58 is connected to the first resistor 56 in series. A node 60 is positioned between the serially connected resistors 56 and 58. The resistor 58 is connected to ground. FIG. 5 also shows the NAND gates 42a, 44a, 46a, 42b, 44b and 46b, word lines 48 and 50, and bit lines 42, 44 and 46 in an arrangement identical that which is shown in FIG. 3 and described above.

As shown in FIG. 5, the word line 48 is supplied with the first word line voltage $V_1$, which is on the order of about 20 V in the programming of a typical NAND array, such that the NAND gates 42a, 44a and 46a on the word line 48 receive a "word program" signal indicating that the word on the word line 48 is being programmed. The word line 50 is applied a second word line voltage $V_2$ representing a "no word program" or "word program-inhibit" signal for the NAND gates 42b, 44b and 46b on the word line 50. The voltage $V_2$ is typically on the order of about 10 V to maintain the NAND gates on the word line 50 in an inhibited or "no program" state during the programming of a typical NAND array. For lower voltage NAND flash memory devices, the word line voltages representing the "word program" and "word program-inhibit" signals may be less than 20 V and 10 V, respectively. Each of the word lines 48 and 50 may be applied either the first word line voltage $V_1$ or the second word line voltage $V_2$ either to program or to inhibit the programming of the NAND gates on the respective word line.

Furthermore, FIG. 5 shows the bit lines 42 and 46 being applied a "program-inhibit" bit line voltage $V_{cc}$, which is equal to the DC select drain gate voltage applied to the select drain gates 42c, 44c and 46c, for setting the respective NAND gates 42a and 46a on the word line 48 in a "program-inhibited" state. A bias voltage $V_{bias}$, which is greater than 0 V, is applied to the bit line 44 for setting the NAND gate 44a on the word line 48 in a "programmed" state. In a typical NAND array, the "program-inhibited" or "no program" state, which is the default state of the NAND gates, is represented by logic bit "1", whereas the "programmed" state is represented by logic bit "0". In response to the applications of the voltages to the word lines and the bit lines in FIG. 5, the word stored in the NAND gates 42a, 44a, 46a, . . . along the word line 48 is 101 . . . as it is read from left to right. Each of the bit lines 42, 44 and 46 may be applied either the voltage $V_{cc}$ or the voltage $V_{bias}$ to set the memory state of the respective NAND gate to either logic bit "1" or logic bit "0", respectively.

The resistances $R_1$ and $R_2$ of the respective resistors 56 and 58 can be determined by the desired bias voltage $V_{bias}$, which is a positive voltage, for example, on the order of about 0.2 V, relative to the select drain gate voltage $V_{cc}$ as described above. The resistor network comprising the serially connected resistors 56 and 58 is illustrative of one of many possible embodiments of providing the bias voltage $V_{bias}$. Alternatively, the programming bit line bias voltage $V_{bias}$ may be supplied from a source separate from that which supplies the "program-inhibit" bit line voltage $V_{cc}$. The present invention is therefore not limited to the voltage division by the serially connected resistors 56 and 58 as shown in FIGS. 4 and 5 and described above; it will be appreciated that other schemes of supplying the bias voltage $V_{bias}$ are also feasible.

INDUSTRIAL APPLICABILITY

The present invention is applicable to non-volatile memory devices, and more particularly to NAND flash memory devices. The bit line biasing scheme according to the present invention allows a bit line to be programmed at a bias voltage $V_{bias}$ of greater than 0 V, for example, at about 0.2 V, to prevent a field turn-on in the substrate region under the select drain gate transistor field oxide region between adjacent bit lines, which are applied voltages $V_{cc}$ and $V_{bias}$ for setting the respective memory gates in "program-inhibited" and "programmed" states, respectively. Therefore, the present invention is able to avoid program disturbances during the programming of the NAND flash memory device by preventing the field turn-on which would otherwise generate an undesirable leakage current between the select gates of different bit lines in a conventional NAND array.

The invention has been described with respect to particular embodiments thereof, and numerous modifications can be made which are within the scope of the invention as set forth in the claims.

What is claimed is:

1. A method of programming a non-volatile memory device comprising a plurality of bit lines, a plurality of word lines, a select drain gate and a select source gate, the method comprising the steps of:

(a) applying a first word line voltage of about 20 V to a first one of the word lines, the first word line voltage representing a word program signal for a respective word on the first word line;

(b) applying a second word line voltage of about 10 V to a second one of the word lines, the second word line voltage representing a word program-inhibit signal for a respective word on the second word line;

(c) applying a bias voltage in the range of about 0.1 V to about 0.3 V to a first one of the bit lines for a respective first memory gate which is disposed on the first word line, to program the first memory gate with a logic bit representing a programmed state; and (d) applying a select drain gate voltage to a second one of the bit lines for a respective second memory gate which is also disposed on the first word line such that the second memory gate maintains a logic bit representing a program-inhibited state.

2. The method of claim 1, wherein the bias voltage is about 0.2 V.

3. The method of claim 1, wherein the logic bit representing the program-inhibited state is logic bit 1 and the logic bit representing the programmed state is logic bit 0.

4. The method of claim 1, further comprising the step of applying a select source gate voltage of 0 V to the select source gate.

5. The method of claim 1, further comprising the step of dividing the select drain gate voltage by a predetermined ratio to obtain the bias voltage.

6. The method of claim 5, wherein the step of dividing the select drain gate voltage comprises the step of dividing the select drain gate voltage by a plurality of resistors to obtain the bias voltage.

7. The method of claim 6, wherein the plurality of resistors comprise first and second resistors connected in series, the first resistor connected to the select drain gate voltage and the second resistor connected to ground, the bias voltage obtained from an intermediate position between the first and second resistors, the first and second resistors having first and second resistances, respectively, and the ratio of the second resistance to the sum of the first and second resistances being equal to the predetermined ratio of the bias voltage to the select drain gate voltage.

8. The method of claim 1, wherein the non-volatile memory device comprises a NAND non-volatile memory device, and the first and second memory gates comprise first and second NAND gates, respectively.

9. The method of claim 1, further comprising the step of applying the select drain gate voltage to the select drain gate.

10. The method of claim 9, wherein the select drain gate voltage is about 3.3 V.

* * * * *